(12) United States Patent
Kallioinen et al.

(10) Patent No.: US 11,296,239 B2
(45) Date of Patent: Apr. 5, 2022

(54) SURFACE MESFET

(71) Applicant: EMBERION OY, Espoo (FI)

(72) Inventors: Sami Kallioinen, Espoo (FI); Helena Pohjonen, Espoo (FI)

(73) Assignee: EMBERION OY, Espoo (FI)

( * ) Notice: Subject to any disclaimer, the term of this patent is extended or adjusted under 35 U.S.C. 154(b) by 0 days.

(21) Appl. No.: 16/353,548

(22) Filed: Mar. 14, 2019

(65) Prior Publication Data

US 2019/0288123 A1 Sep. 19, 2019

(30) Foreign Application Priority Data

Mar. 14, 2018 (FI) .................................. 20185237

(51) Int. Cl.
*H01L 29/08* (2006.01)
*H01L 29/812* (2006.01)
(Continued)

(52) U.S. Cl.
CPC .. *H01L 29/8124* (2013.01); *H01L 21/823871* (2013.01); *H01L 23/528* (2013.01); *H01L 27/0629* (2013.01); *H01L 27/095* (2013.01); *H01L 27/14612* (2013.01); *H01L 29/0891* (2013.01); *H01L 29/1029* (2013.01); *H01L 29/245* (2013.01); *H01L 29/247* (2013.01); *H01L 29/401* (2013.01); *H01L 29/41766* (2013.01); *H01L 29/42316* (2013.01); *H01L 29/66969* (2013.01); *H01L 29/8126* (2013.01);
(Continued)

(58) Field of Classification Search
CPC .......................... H01L 29/8124; H01L 27/095
See application file for complete search history.

(56) References Cited

U.S. PATENT DOCUMENTS

| 4,321,613 A | 3/1982 | Hughes et al. |
| 5,148,244 A | 9/1992 | Iwasaki |

(Continued)

FOREIGN PATENT DOCUMENTS

| EP | 0124277 A1 | 11/1984 |
| EP | 3 214 656 A1 | 9/2017 |

(Continued)

OTHER PUBLICATIONS

Jun. 11, 2019 Search Report issued in International Patent Application No. PCT/FI2019/050173.
(Continued)

*Primary Examiner* — Trang Q Tran
(74) *Attorney, Agent, or Firm* — Squire Patton Boggs (US) LLP

(57) ABSTRACT

A MESFET transistor on a horizontal substrate surface with at least one wiring layer on the substrate surface. The transistor comprises source, drain and gate electrodes which are at least partly covered by a semiconducting channel layer. The source, drain and gate electrodes optionally comprise interface contact materials for changing the junction type between each electrode and the channel. The interface between the source electrode and the channel is an ohmic junction, the interface between the drain electrode and the channel is an ohmic junction, and the interface between the gate electrode and the channel is a Schottky junction. The substrate is a CMOS substrate.

10 Claims, 9 Drawing Sheets

(51) Int. Cl.

| | | |
|---|---|---|
| *H01L 23/528* | (2006.01) | |
| *H01L 29/417* | (2006.01) | |
| *H01L 29/423* | (2006.01) | |
| *H01L 27/095* | (2006.01) | |
| *H01L 27/146* | (2006.01) | |
| *H01L 29/66* | (2006.01) | |
| *H01L 29/40* | (2006.01) | |
| *H01L 29/10* | (2006.01) | |
| *H01L 29/24* | (2006.01) | |
| *H01L 27/06* | (2006.01) | |
| *H01L 31/112* | (2006.01) | |
| *H01L 21/8238* | (2006.01) | |
| *H01L 29/45* | (2006.01) | |

(52) U.S. Cl.
CPC .......... *H01L 31/1123* (2013.01); *H01L 29/24* (2013.01); *H01L 29/45* (2013.01)

(56) References Cited

U.S. PATENT DOCUMENTS

| | | |
|---|---|---|
| 5,532,173 A | 7/1996 | Martin et al. |
| 5,705,846 A | 1/1998 | Merrill |
| 5,710,068 A | 1/1998 | Hill |
| 5,804,847 A | 9/1998 | Robinson |
| 6,512,280 B2 | 1/2003 | Chen et al. |
| 6,720,589 B1 | 4/2004 | Shields |
| 2005/0053524 A1 | 3/2005 | Keersmaecker et al. |
| 2008/0179637 A1* | 7/2008 | Henning ............. H01L 29/0607 257/280 |
| 2014/0070223 A1* | 3/2014 | Dykaar ............... H01L 21/0259 257/66 |
| 2016/0373106 A1* | 12/2016 | Shah ................... H01L 27/0629 |

FOREIGN PATENT DOCUMENTS

| | | |
|---|---|---|
| EP | 3 252 831 A1 | 12/2017 |
| JP | S 56-125876 A | 10/1981 |
| JP | 2002-76356 A | 3/2002 |
| JP | 2006-513122 A | 4/2006 |
| JP | 2011-181905 A | 9/2011 |
| JP | 2015-529019 A | 10/2015 |
| KR | 10-1993-0011290 | 6/1993 |
| KR | 10-1999-0000346 | 1/1999 |

OTHER PUBLICATIONS

Finnish Search Report dated Sep. 26, 2018 corresponding to Finnish U.S. Appl. No. 20/185,237.

Korean Office Action issued in corresponding Korean Patent Application No. 2020-7029458 dated Aug. 17, 2021, with English summary thereof.

Notice of Reasons for Refusal issued in corresponding Japanese Patent Application No. 2020-548974 dated Nov. 8, 2021.

* cited by examiner

SURFACE MESFET

FIELD OF THE DISCLOSURE

The present disclosure relates to transistors, and more particularly to metal-semiconductor field-effect transistors (MESFETs). The present disclosure also concerns the use of semiconducting materials that are processable in low temperatures as MESFET channels. The present disclosure further concerns the manufacture of MESFETs on complementary metal-oxide semiconductor (CMOS) substrates in a configuration where the channel may overlie the electrodes of the transistors. It may also overlie other elements, such as capacitors and resistors which can be implemented within the CMOS substrate and/or in tightly connected wiring layers on top of the substrate. The wiring layers may comprise alternating dielectric and conductive layers, and they may form electrical interconnections between all CMOS elements (transistors, diodes, resistors, capacitors etc.).

BACKGROUND OF THE DISCLOSURE

CMOS circuit designs are widely used in a variety of microelectronic devices and image sensors due to their immunity to noise and low power consumption. In addition to active elements such as nMOS and pMOS transistors formed in a silicon substrate, and associated gate layers, CMOS circuits typically include between 1-12 stacked wiring layers on top of the substrate for connecting the active elements of the circuit to each other. Passive elements such as resistors, capacitors and coils may also be formed in these wiring layers and connected to the circuit.

The electrical characteristics of CMOS circuits make them suitable to be used as control circuits for power amplifying and noise-sensitive devices such as optoelectronic sensors. Most battery-powered imaging systems use CMOS substrates and diodes embedded in the CMOS substrate due to the benefit of having few parts in the system without needing high driving voltages.

In CMOS photodetectors, optical sensors have typically been integrated into the silicon substrate. Document U.S. Pat. No. 6,512,280 discloses a CMOS structure where a photodiode forms the light-sensitive element, while document U.S. Pat. No. 5,705,846 discloses a CMOS structure where a junction field-effect transistor forms the light-sensitive element.

However, the sensitivity of photodiodes and JFETs integrated into the CMOS substrate is relatively low, and/or they require the formation of a cavity, either through the connection and wiring layers which form the front side of the CMOS circuit or through back side of the CMOS substrate, so that light can reach the optical sensor. This makes the manufacturing process relatively complex and increases the number of masking steps.

BRIEF DESCRIPTION OF THE DISCLOSURE

An object of the present disclosure is to provide an apparatus to alleviate the above disadvantages.

The object of the disclosure is achieved by an arrangement which is characterized by what is stated in the independent claims. The preferred embodiments of the disclosure are disclosed in the dependent claims.

The disclosure is based on the idea of preparing a MESFET transistor on top of a substrate where source, gate and drain electrodes are present on the substrate surface. The electrodes are located on or inside a dielectric/isolating layer.

An advantage of the arrangement presented in this disclosure is that an optical sensor can be integrated directly on the front surface of a substrate, such as a CMOS substrate with metallic connectors, and no invasive and pixel area consuming steps, or cavity-formation steps, need to be formed on the substrate before or after the optical sensor has been manufactured. The presented arrangement provides higher effective pixel area than detectors that need cavity formation, and the end-result is a more planar surface which can if needed be used for further process steps without any non-planarity constraints.

BRIEF DESCRIPTION OF THE DRAWINGS

In the following the disclosure will be described in greater detail by means of preferred embodiments with reference to the accompanying drawings, in which.

DETAILED DESCRIPTION OF THE DISCLOSURE

Figure 1:
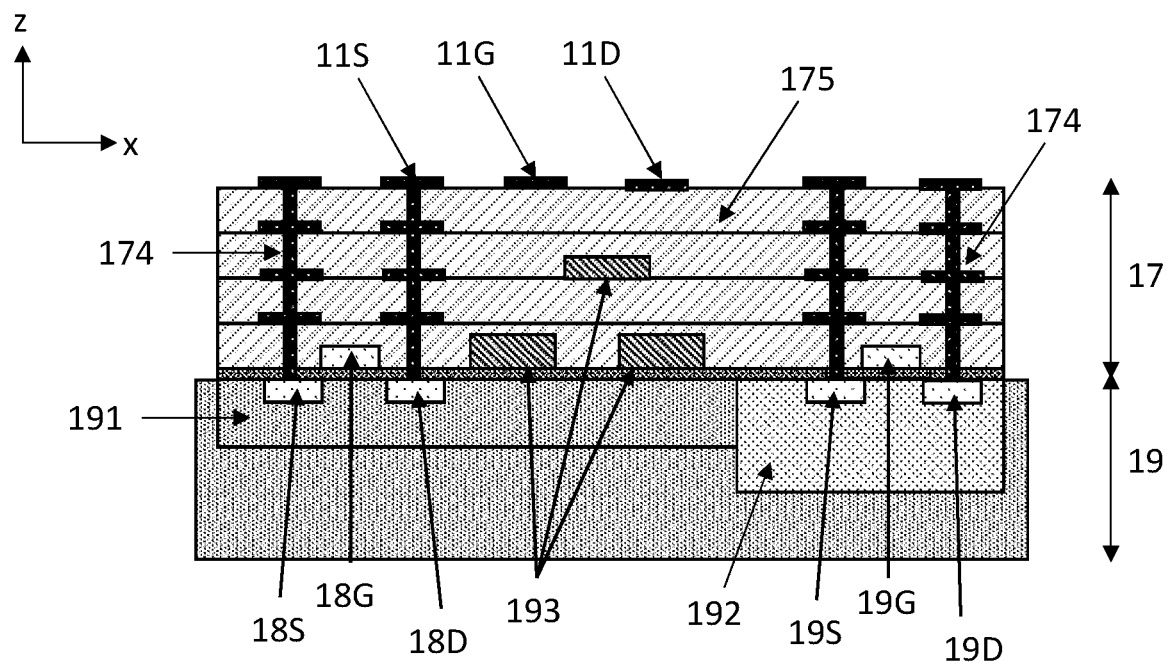
FIG. 1 illustrates a CMOS substrate with wiring layers on top.

FIG. 1 illustrates schematically a CMOS substrate with four wiring layers on top. The substrate itself may, for example, be a p-doped silicon substrate 19 with a p-well 191 and an n-well 192. The active elements of the CMOS substrate may include an nMOS transistor with source, gate and drain electrodes 18S, 18G and 18D, respectively, and a pMOS transistor with source, gate and drain electrodes 19S, 19G and 19D, respectively. The gate electrodes 18G and 19G may be made at least as conductive as the metallic interconnections in the wiring layers. In some cases, the gate electrodes may be made of the same metal as metallic parts of the wiring layers. If the number of wiring layers is small, the gate electrodes 18G and 19G could even form one of the MESFET electrodes described below.

The interconnections between different parts of the CMOS device may be deposited in a stack of wiring layers 17 on top of the substrate 19. The layers in this stack 17 may include passive elements 193 such as capacitors, resistors or coils. Horizontal conductive connectors which connect various elements to each other, and vertical conductive pillars 174 which extend up to the top of the stack and facilitate external connections to the CMOS circuit, may be formed in the wiring layers 17. The wiring layers 17 may also comprise dielectric material 175 which isolates the electric conductors in the wiring layers from each other.

The number of wiring layers 17 is typically the minimum needed to interconnect all electrical elements (transistors, capacitors, resistors etc.). Typically, the minimum number of wiring layers above the nMOS and/or pMOS gate layer(s) is one. Any wiring layer can consist of one or more material layers. If there are many material layers in each wiring layer, these layers are typically on top each other: the first layer may for example provide heat dissipation, and the other(s) electrical connection between transistors and other elements like resistors, capacitors, coils etc. There are no limitations to the thickness of a wiring layer. They can be as thin as one atomic layer (such as a layer of graphene, $MoS_2$ or any 2D material), if they function as the conducting channel of a transistor.

It is possible to pause manufacturing of the wiring layers 17, including the nMOS and pMOS gate material layer, at any stage, and to pattern additional electric contacts, which may or may not be connected to the elements in the underlying wiring layers and silicon substrate, on the topmost layer. FIG. 1 illustrates three contacts 11S, 11G and 11D in the topmost wiring layer, which may form the source, gate and drain electrodes, respectively, of a MESFET transistor deposited on the CMOS substrate.

A CMOS substrate with wiring on top imposes certain restrictions on direct integration with optical sensors. The metallic wiring 174, 11S, 11G, 11D in a CMOS circuit may comprise primarily aluminium. It may, for example, comprise aluminium-copper (with a few percent of copper) or aluminium-silicon, or similar materials. Such wiring materials typically limit the maximum temperature of subsequent processing to about 400 . . . 450° C. (depending on the exact composition used). The materials which form the optical sensor must therefore be processable at relatively low temperatures. They must nevertheless exhibit sufficient light absorption, and in the case of field-effect transistors also sufficient carrier mobility in the channel, to be operable as optical sensors.

This disclosure describes a metal-semiconductor field-effect transistor arrangement which comprises a horizontal substrate with at least one wiring layer on the substrate surface. The topmost wiring layer comprises a first source region with a first bottom source electrode, a first drain region with a first bottom drain electrode, and a first gate region with a first bottom gate electrode. Each of the bottom source, bottom drain and bottom gate electrodes comprises at least an electrically conducting first metal contact.

The arrangement also comprises a first semiconducting channel layer which at least partly covers the first bottom source electrode, the first bottom drain electrode and the first bottom gate electrode. The interface between the first bottom source electrode and the first semiconducting channel layer is an ohmic junction, the interface between the first bottom drain electrode and the first semiconducting channel layer is an ohmic junction, and the interface between the first bottom gate electrode and the first semiconducting channel layer is a Schottky junction.

In this disclosure, the term "horizontal" refers to the xy-plane, partially illustrated with the x-axis in FIG. 1, while the term "vertical" refers to the z-direction. Terms such as "top," "bottom", "vertical" and "horizontal" do not imply anything about the orientation of the substrate when the device is manufactured, or when the device is in use. The device and the substrate may be oriented in any suitable direction during usage and manufacturing, for example sideways in such a manner that a layer which is in this disclosure referred to as "horizontal", becomes vertical. In other words, the terms "horizontal" and "vertical" merely define two orthogonal directions, one of which is parallel to the substrate surface, and the other of which is normal to this surface.

In this disclosure, the verb "cover" refers to vertical alignment with direct contact. When a first layer "covers" a second layer on a given area, the first layer and the second layer are vertically aligned on this area, and they are in direct contact with each other. In other words, the two layers have been sequentially deposited on a given area of the substrate. They are vertically aligned because the second layer has been deposited on this area first, and then the first layer has been deposited on the same area. Within this area, the second layer therefore lies below the first layer in the vertical direction. The first layer "covers" the second layer in this area because no other layers lie between the first and the second layer.

The verb "cover", when used with no further qualifiers, refers to complete vertical alignment where no area of the second layer is uncovered by the first layer. Qualified expressions such as "partly cover" are used to refer to partial vertical alignment, where there is an area of the second layer which is not covered by the first layer. Qualified expressions such as "at least partly cover" are used to refer to vertical alignment which can be either complete or partial.

In this disclosure, the verbs "overlie" and "underlie" refer to vertical alignment without direct contact. When a first layer "overlies" or "underlies" a second layer on a given area, the first layer and the second layer are vertically aligned, but they are not in direct contact with each other. In other words, the two layers have both been deposited on a given area of the substrate, but a third intervening layer has been deposited between them. These three layers are all vertically aligned on this area.

In addition to direct physical contact, the term "in contact with" can in this disclosure in some contexts mean electrical contact without direct physical contact. In other words, when a first layer, or a portion of a first layer, is in contact with a second layer, the first layer can be physically separated from the second layer by an intermediate layer, such as a specialised electron or hole transport/blocking layer, but still be in contact with the second layer because the intermediate layer is sufficiently thin to allow charge carriers to pass through it. If charge carriers can pass through the intermediate layer, for example by tunnelling, then the first layer may still be considered to be "in contact with" the second layer. The first layer can also be in direct physical contact with a second layer at an interface where no current passes through.

The junction type between an electrode and a semiconducting channel layer is determined by their respective materials. It is also influenced by the doping level in the semiconducting material which forms the channel layer. More generally the junction type is determined by the difference in work function between the materials in (i) the layer in the electrode which lies closest to the interface and (ii) the semiconducting channel. An ohmic junction exhibits a linear current-voltage relationship, whereas a Schottky junction exhibits a rectifying, non-linear current-voltage relationship. For most metal-semiconductor junctions, the rectifying voltage is typically lower than the rectifying voltage of a typical pn-junction between differently doped semiconductors.

A MESFET transistor is operated by driving a current through the transistor channel, from the source electrode to the drain electrode, with a drain-source voltage $V_{DS}$. When a gate voltage $V_G$ is simultaneously applied to the gate, it creates a depletion region in the channel, which strongly influences the source-drain current. If the gate voltage is sufficiently, and the applied source-drain voltage and channel conductivity are sufficiently low, the source-drain current can be shut down entirely. The MESFET transistor can act in this case as a logic element because it can be switched to the off-state with very low leakage current, and if needed turned to the on-state with a gate voltage controlling the current from source to drain.

In contrast to diode structures, transistors have electrical power amplification. Therefore, in addition to detecting optical signals, they can amplify the detected signal and perform the first amplification stage(s) which are needed before the detected signal is fed to analog digital converter(s) and further buffering. MESFET transistors can also act as switches in array imagers, where they may replace row or column switches that use nMOS and pMOS available in CMOS technology.

If the MESFET transistor is to be used as an optical sensor, the electromagnetic radiation whose intensity is to be measured is directed to the semiconducting channel layer, where at least some of it is absorbed. The charge carriers released by the absorbed radiation also modulates the conductivity of the channel, and this light-dependent change in conductivity is proportional to the intensity of the incident radiation.

The voltage values $V_{DS}$ and $V_G$ are in principle freely selectable and depend on the chosen materials. Practical experimentation is needed MESFET transistors to determine the operation point where the greatest light-sensitivity can be reached. Other design constraints may of course also set limits on the available source-drain voltage and the gate voltage.

In this disclosure, the term "electrode" refers to a conducting element which is in contact with the semiconducting channel. This element may comprise one or two layers. One layer in an electrode may be a metal contact. The term "metal contact" refers to a part of a patterned conductive layer which is first deposited either on the substrate surface or on a stack of wiring layers, or which is already present on the substrate surface or on a stack of wiring layers, when the manufacturing of the MESFET transistor begins. The patterned conductive layer may form a part of a wiring layer, and/or it may form the gate material layers of nMOS and pMOS transistors in the CMOS substrate.

In a single-layered electrode, the metal contact forms the only layer of the electrode. In a double-layered electrode, an additional interface contact is deposited on top of the metal contact, so that the junction between the electrode and the semiconducting channel layer is formed by the interface contact, not by the metal contact. By selecting the material in the interface contact suitably, the electric properties of the electrode/channel junction can be tailored.

Figure 2:
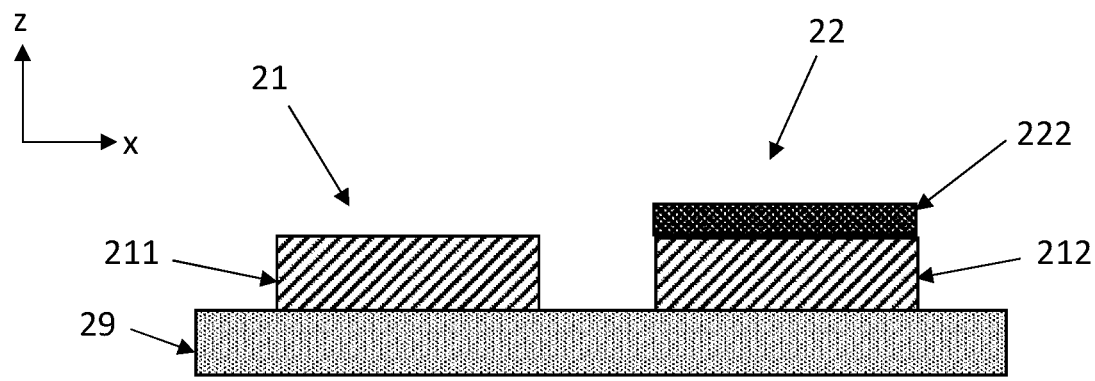
FIG. 2 illustrates a single-layered electrode and a double-layered electrode.

FIG. 2 illustrates a single-layered electrode 21 and a double-layered electrode 22 on the surface of a substrate 29. The single-layered electrode 21 comprises only a metal contact 211. The double-layered electrode 22 comprises both a metal contact 212 and an interface contact 222. The electrodes could also form a part of a wiring layer.

As described in the embodiments below, depending on the material in the semiconducting channel layer and the material(s) used for the metal contact, the interface contact may be included in no electrode, or alternatively only in the gate electrode, or alternatively only in the source and drain electrodes, or alternatively in all electrodes, to form the desired junction type at each electrode/channel interface.

First Embodiment

FIGS. 3a-3i illustrate a method for manufacturing a metal-semiconductor field-effect transistor arrangement according to a first embodiment. In this embodiment, the first bottom source electrode also comprises a first interface contact which is covered by the first semiconducting channel layer and which covers the first metal contact in the first source region, and the first bottom drain electrode also comprises a first interface contact which is covered by the first semiconducting channel layer and which covers the first metal contact in the first drain region, so that the first interface contacts form the interface to the first semiconducting channel layer in the first source and drain regions. The semiconducting channel layer can be formed with nanocrystals, nanoplatelets, quantum dots, or a thin film either as a single layer or as a stack with many layers of semiconducting elements.

Figure 3A:
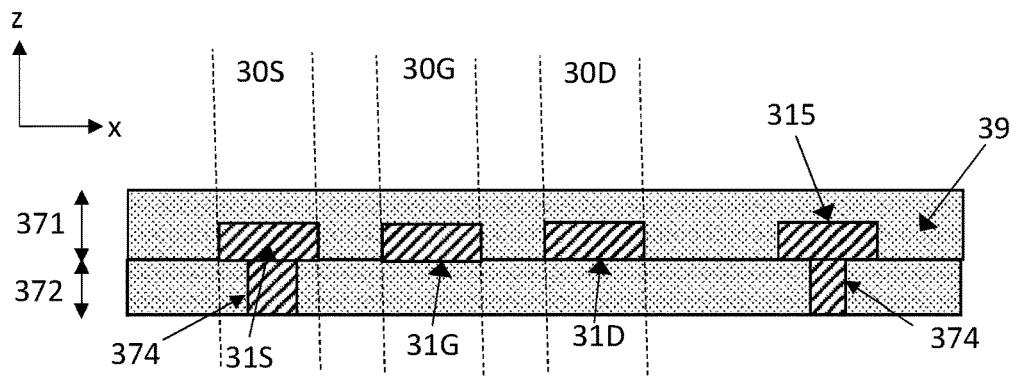
FIGS. 3a-3i illustrate the manufacturing of a MESFET arrangement according to a first embodiment.

In FIG. 3a, 30S illustrates a first source region on a substrate surface, 30G illustrates a first gate region, and 30D illustrates a first drain region. 31S, 31G and 31D are metal contacts formed in a wiring layer 371. The wiring layer 371 may cover other wiring layers, such as the layer 372 in FIG. 3a. Alternatively, the wiring layer may cover the surface of a substrate (this option is not illustrated).

The wiring 371 layer may include other contacts which may be used as electric conductors for other purposes, such as 315 in FIG. 3a. The wiring layer 371 may include an insulating material 39 which separates the metal contacts 31S, 31G and 31D from other contacts in the stack of wiring layers. The substrate on which the wiring layers have been stacked a CMOS substrate, such as the one illustrated in FIG. 1, with vertical conductive pillars 374 optionally extending downward from some or all of the metal contacts. In other words, the metal contacts may be vertically connected to underlying circuitry and/or horizontally connected to circuitry in the same horizontal plane.

To simplify the figures, the underlying wiring layer 372 will not be shown in the remaining figures. The arrangement illustrated in this embodiment, with stacked wiring layers on a substrate surface, or alternatively just one wiring layer on a substrate surface, may also be used in any of the subsequent embodiments. In any embodiment presented in this disclosure, the substrate may be a CMOS substrate In FIG. 3a, metal contacts 31S, 31G and 31D are all made of the same material, which may for example be aluminium, or a mixture of Al, Al—Cu and/or Al—Si. The junction which this material forms with the semiconducting channel layer 331 will depend on the semiconducting material selected for this layer (see FIG. 3g). As indicated above, the primary requirements for the semiconducting material are that it should be processable at relatively low temperatures, preferably below 400° C., and that it exhibits sufficient light absorption and carrier mobility to function as a transistor channel in a MESFET-based optical sensor.

In any embodiment presented in this disclosure, the semiconducting channel layer may comprise semiconductor nanocrystals, colloidal quantum dots or nanobelt materials selected from the group: PbS, PbSe, PbTe, CdS, CdSe, CdTe, ZnS, ZnO, CuS, $Cu_2S$, $Cu_2Se$, CZTS, MnS, $Bi_2S_3$, $Ag_2S$, $Ag_2Se$, HgTe, HgCdTe, GaSe, $MoS_2$, ClS, InAs, InSb, Ge, Si, graphene, or core/shell nanocrystals with any of the preceding core/shell constituents, or similar elementary materials or their pairs with the same functionality. Both ohmic and Schottky contacts can be manufactured to layers of these materials by selecting suitable materials for the source, drain and gate electrodes.

Alternatively, in any of the embodiments presented in this disclosure, the semiconducting channel layer may comprise any of the preceding semiconductor nanocrystals or colloidal quantum dots embedded in a host material comprising metal chalcogenide, metal halide, or hybrid halide perovskite. The metal chalcogenide may have the general formula $ME_n$, where E is S, Se or Te, and it may for example be $AsS_x$, CdS, CdSe, CdTe, $CuInS_2$, $SnS_x$, $In_2Se$ or $Bi_2Te_3$. The metal halide may have the general formula $MX_n$, where M is Pb, Bi, Cd, In, Zn, Sn, Cu, Fe, Ga, Li or Sb and X is I, Br or Cl, and it may for example be $PbI_2$ or $BiI_3$. The hybrid halide perovskite may have the general formula $ABX_3$, where A is Cs, $CH_3NH_3$ or $NH_2CH_2=NH_2$, B is Pb or Sn, and X is Cl, Br or I.

The quantum dot loading in the host material may vary between 1% and 90%. The diameter of the semiconductor nanocrystals or quantum dots may, for example, be in the range 2-20 nm. The semiconducting channel layer may provide substantial optical absorption in the wavelength range of 0.4-5 μm, defined by the optical bandgap of materials used.

The capping ligands on the above semiconductor materials may comprise organic molecules or inorganic molecules, or a combination of both. Organic ligands may include, but are not limited to, alkyl or aryl thiols, such as 1,2-ethanedithiol, 3-mercaptopropionic acid, benzenethiol, etc. Organic ligands may also include alkyl or aryl amines, N-heterocycles, such as 1,2-ethylenediamine, pyridine, etc. Inorganic ligands may include atomic halogens (I, Br, Cl), pseudo halogens (SCN), or chalcogens (S, Se). Inorganic ligands may also include metal halides or metal chalcogenides.

However, in any of the embodiments presented in this disclosure, the semiconducting channel layer may also be a thin-film semiconducting layer with a crystalline or amorphous structure. The thin-film semiconducting layer may comprise a material selected from the group: PbS, PbSe, PbTe, CdS, CdSe, CdTe, ZnS, ZnO, CuS, $Cu_2S$, $Cu_2Se$, CZTS, MnS, $Bi_2S_3$, $Ag_2S$, $Ag_2Se$, HgTe, HgCdTe, GaSe, $MoS_2$, ClS, InAs, InSb, Ge, or Si.

Interface contact materials may include metals such as aluminium, indium, gold, titanium, palladium, and/or metal alloys such as chromium-gold. Conductive oxides such as indium tin oxide or zinc oxide may also be used as interface contact materials.

The interface contacts, the semiconducting channel layer and the top electrodes described in any embodiments of this disclosure may, for example, be deposited on the substrate with chemical vapour deposition, atomic layer deposition, or similar methods. In some cases, the optical properties of the semiconducting channel layer can be improved by annealing at low temperatures, for example 80 . . . 150° C. depending on the materials.

By way of example, the semiconducting material used in channel layer 331 may be PbS and the material used in metal contacts 31S, 31G and 31D may be aluminium or titanium. In this case the junction between the metal contacts and the channel layer is a Schottky junction if they are in direct contact with each other. In other words, if a bottom gate electrode, for example, consists of only the metal contact, so that no interfacial contact is present, then the junction between the bottom gate electrode and the semiconducting channel is a Schottky junction.

Figure 3B:
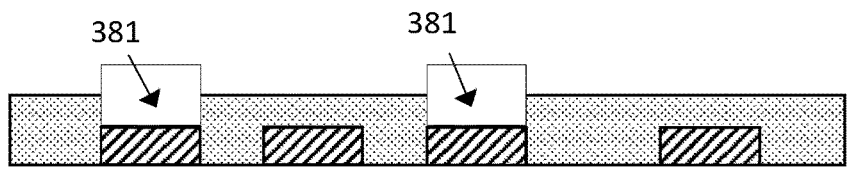
Figure 3C:
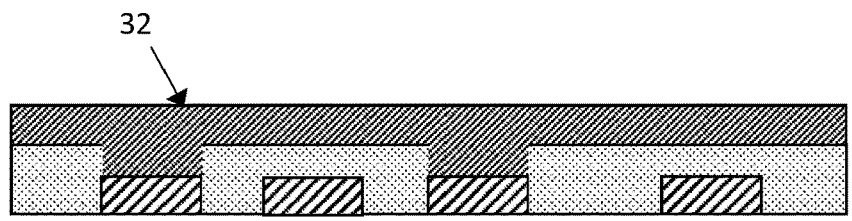
Figure 3D:
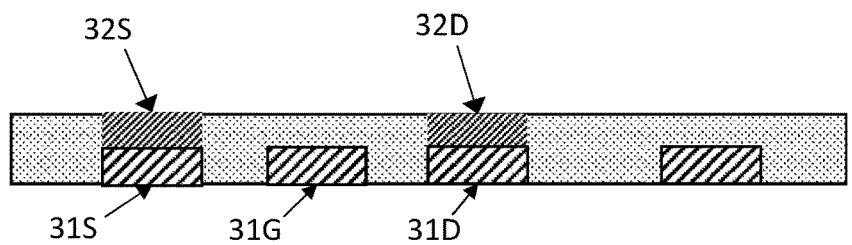

Therefore, with these material choices an interface contact is needed in the source and drain electrodes to change their junction with the semiconducting channel to an ohmic type. In FIG. 3*b*, first openings 381 have been etched in insulating material 39 in the first source region and the first drain region. A layer comprising a layer of first interface contact material 32 may then be deposited over the wiring layer 371 so that it covers at least these openings 381. With the exemplifying material choices specified above, i.e. aluminium in 31S, 31G and 31D, and PbS in the semiconducting channel 331, the first interface contact material may, for example, be gold (Au). The layer 32 may then be patterned to form interface contacts 32S and 32D. The metal contact 31S and interface contact 32S now together form the bottom source electrode, while metal contact 31D and interface contact 32D now together form the bottom drain electrode, while metal contact 31G alone forms the bottom gate electrode.

Figure 3E:
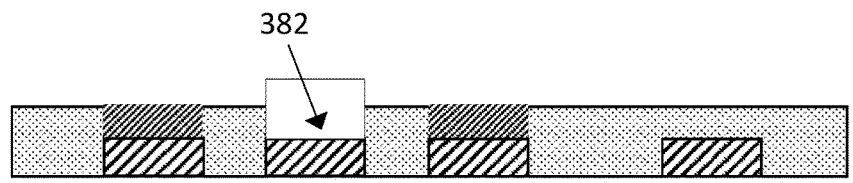
Figure 3F:
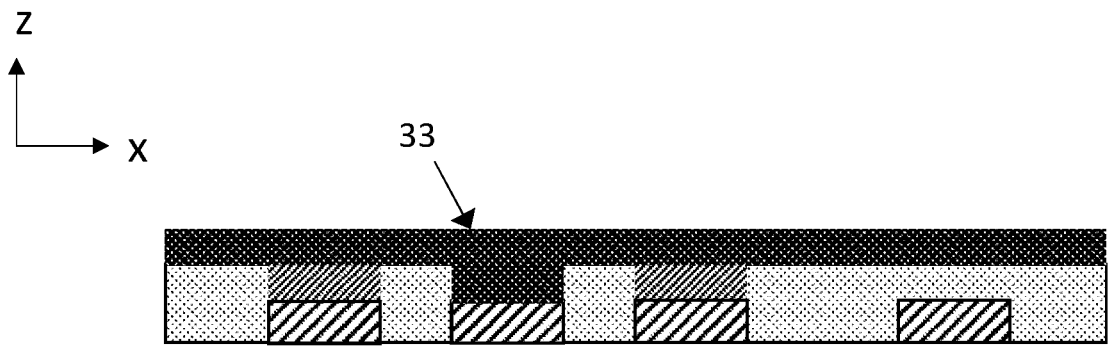
Figure 3G:
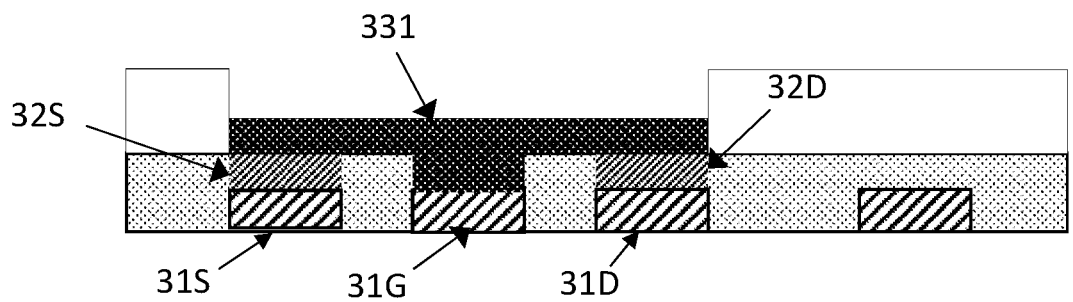

A second opening 382 may be etched in insulating material 39 in the first gate region, and a layer of semiconducting channel material 33 (PbS in this example) may then be deposited over the wiring layer 371 and optionally patterned so that it covers at least the first source, gate and drain regions and the intervening area, as illustrated in FIG. 3*g*. Due to the properties of the selected materials, the junctions between the interface contacts 32S/32D and the semiconducting channel 331 are ohmic, while the junction between the metal contact 31G and the semiconducting channel 331 is a Schottky junction. A MESFET transistor has thereby been formed on the wiring layer.

Figure 3H:
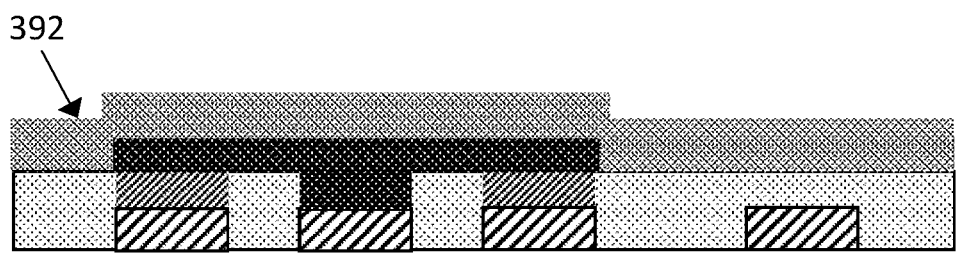
Figure 3I:
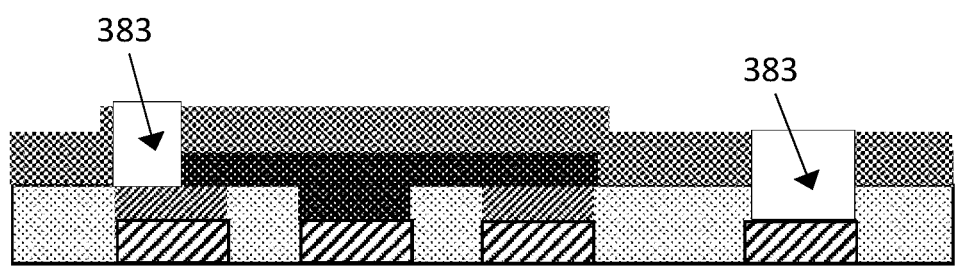

One or more passivation layers 392 may be deposited on the substrate so that they cover the MESFET transistor, as illustrated in FIG. 3*h*. They may be transparent and they may have antireflective properties. Third openings 383 may optionally be formed in the passivation layers, if one or more of the electrodes or metal contacts in the wiring layer are to be connected to circuitry above the passivation layers 392.

Second Embodiment

FIGS. 4*a*-4*d* illustrate a method for manufacturing a metal-semiconductor field-effect transistor arrangement according to a second embodiment. In this embodiment, the first bottom gate electrode also comprises a second interface contact which is covered by the first semiconducting channel layer and which covers the first metal contact in the first gate region, so that the second interface contact forms the interface to the first semiconducting channel layer in the first gate region.

This embodiment may optionally be combined with the first embodiment, so that the first bottom source electrode again comprises a first interface contact which is covered by the first semiconducting channel layer and which covers the first metal contact in the first source region, and the first bottom drain electrode comprises a first interface contact which is covered by the first semiconducting channel layer and which covers the first metal contact in the first drain region, so that the first interface contacts form the interface to the first semiconducting channel layer in the first source and drain regions. Alternatively, the first bottom source electrode and the first bottom drain electrode may comprise only a metal contact and no interface contact. As in the previous embodiment, these choices are made based on the selected materials, so that the desired junction is formed at each interface.

FIGS. 4*a*-4*d* illustrate a method for the first bottom source electrode and the first bottom drain electrode interface contacts. Reference numbers 41S, 41G, 41D, 42S and 42D correspond to reference numbers 31S, 31G, 31D, 32S and 32D in FIG. 3*d*.

Figure 4A:
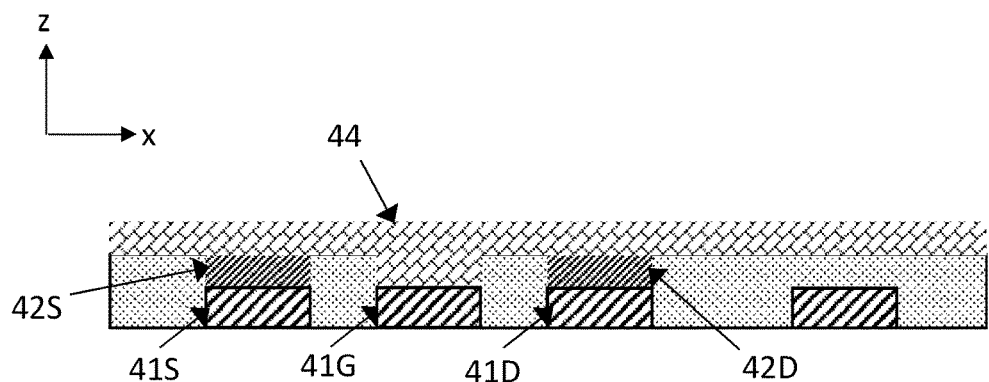
FIGS. 4a-4d illustrate the manufacturing of a MESFET arrangement according to a second embodiment.
Figure 4B:
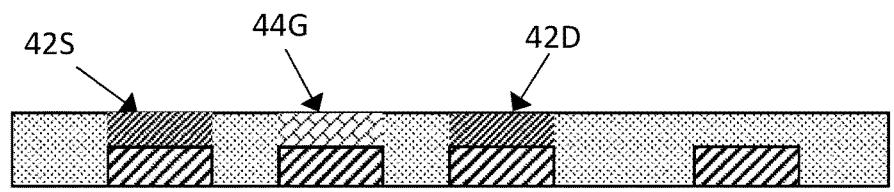

FIG. 4*a* illustrates a method step which may be performed after the step illustrated in FIG. 3*e*. By way of example, the semiconducting material used in channel layer 431 in FIG. 4*d* may be PbS and the material used in metal contacts 41S, 41G and 41D may again be aluminium. The first interface contact material which forms interface contacts 42S and 42D may, for example, be gold (Au). A layer 44 of second interface contact material 44, for example aluminium or titanium, may be deposited so that it covers at least the first source, gate and drain regions, as illustrated in FIG. 4a. This layer may be patterned so that the second interface contact material forms an interface contact 44G in the first gate region, as illustrated in FIG. 4b.

Figure 4C:
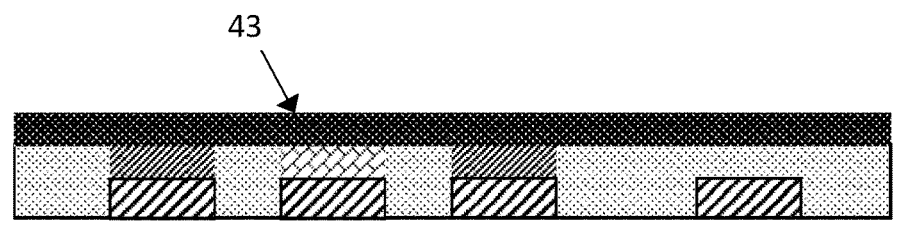
Figure 4D:
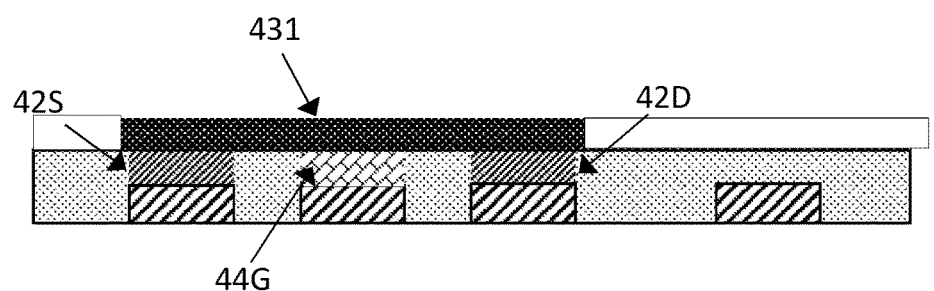

The semiconducting material 43 which forms the channel 431 in the MESFET transistor may then be deposited so that it covers at least the first source, gate and drain regions and the intervening area, and optionally patterned, as illustrated in FIGS. 4c and 4d. Due to the properties of the selected materials, the junctions between the interface contacts 42S/42D and the semiconducting channel 431 are ohmic, while the junction between the interface contact 44G and the semiconducting channel 431 is a Schottky junction. A MESFET transistor has thereby been formed on the wiring layer. The passivation procedure with optional patterning depicted in FIGS. 3h-3i may also be carried out in this second embodiment.

Alternatively, if the first bottom source electrode and the first bottom drain electrode comprise only a metal contact and no interface contact, the process step illustrated in FIG. 3b would instead comprise the formation of a first opening only in the first gate region 30G, but not in the first source region 30S or the first drain region 30D. The process would then include the deposition of second interface contact material over the first gate region, the formation of second openings in the first source region and the first drain region, and the deposition of the semiconducting material 431 over all of these regions and the intervening areas. This alternative sequence has not been separately illustrated because it is a simply variation of the sequences presented in FIGS. 3a-3i and 4a-4d. It can be used when the metal contacts form an ohmic junction to the semiconducting material, but an interface contact is needed in the bottom gate electrode to form a Schottky junction with the channel layer.

Third Embodiment

A top gate electrode can be added to any of the other embodiments presented in this disclosure. A top gate may increase the vertical depth of the Schottky junction in the semiconducting channel layer, which may be useful if very thick active MESFET channel layers (for example nanocrystals or nanoplatelets) are used. A top gate can thereby change and stabilise the photosensitive response of the MESFET transistor.

FIGS. 5a-5d illustrate the addition of a top gate electrode to a device according to the first embodiment, but the same method can be applied in combination with any of the other embodiments. Reference numbers 51S, 51G, 51D, 52S and 52D correspond to reference numbers 31S, 31G, 31D, 32S and 32D in FIG. 3d.

Figure 5A:
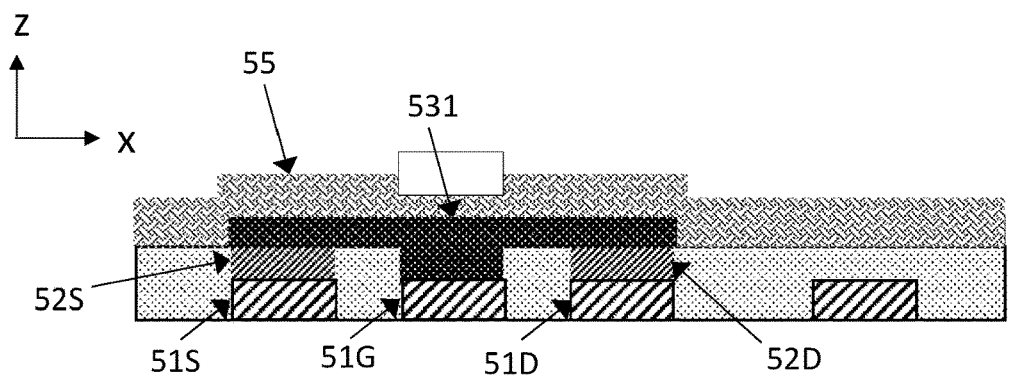
FIGS. 5a-5e illustrate the addition of top gate, source and drain electrodes to a MESFET arrangement.
Figure 5B:
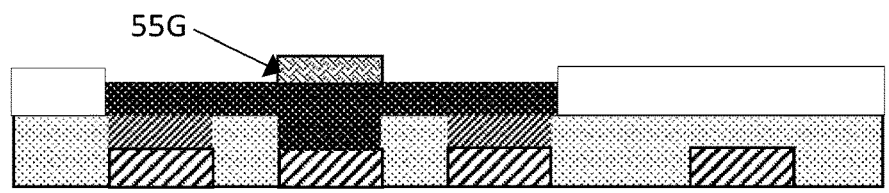

In this embodiment, the MESFET transistor arrangement further comprises a first top gate electrode which at least partly covers the first semiconducting channel layer in the first gate region. FIG. 5a illustrates a process step which may follow the step illustrated in FIG. 3g. A layer top gate material 55 is deposited on the substrate so that it covers at least the semiconducting channel 531, and then patterned so that it covers the channel in the first gate region, as illustrated in FIG. 5b. A top gate electrode 55G has thereby been formed on the channel 531. The top gate electrode 55G may extend beyond the first gate region. The corresponding process can be carried out after the step illustrated in FIG. 4d.

The material of the top gate electrode should be such that it forms a Schottky junction to the semiconducting channel 531. However, it may not necessarily be the same material as the metal contact or the interface contact in the bottom gate electrode, because the top electrode should preferably be at least partly transparent. If the material in the semiconducting channel is for example PbS, PbSe or similar, as in the first embodiment, the top gate electrode may be made of a transparent conductive oxide such as ITO, or graphene for example. Alternatively, with other semiconducting channel materials the material of the top gate electrode may, for example, be made of aluminium or titanium.

A separate interface contact is typically not required in a top gate electrode because its material may be freely selected. If no suitably transparent and conductive material is available for creating the desired contact to a given channel material, the top gate electrode may be omitted.

Figure 5C:
Figure 5D:
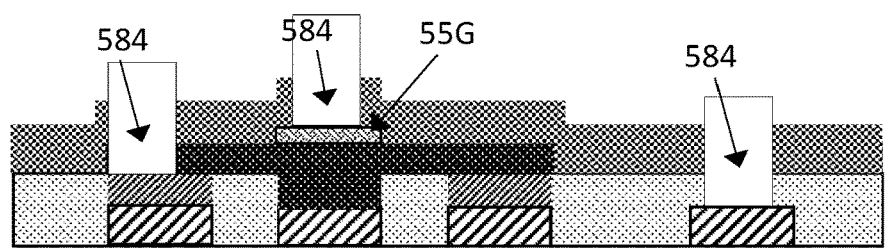

A passivation layer 592 may then be deposited on the substrate, and openings 584 for top contacting may be opened in the passivation layer, as illustrated in FIGS. 5c-5d. The top gate electrode must typically be contacted from above, as FIG. 5d illustrates.

The arrangement according to any embodiment in this disclosure may also comprise a first top source electrode which at least partly covers the first semiconducting channel layer in the first source region, and a first top drain electrode which at least partly covers the first semiconducting channel layer in the first drain region. They may be deposited with the same method illustrated in FIGS. 5a-5b, except that the electrode pattern is prepared over the first source region and first drain region instead of the first gate region.

Figure 5E:
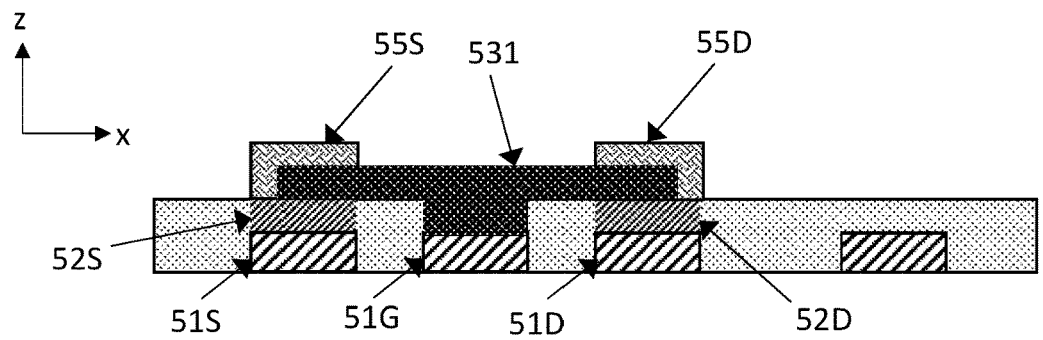

FIG. 5e illustrates the addition of a top source electrode 55S and a top drain electrode 55D which partly cover the first semiconducting channel layer 531 in the first source region and the first drain region, respectively. The illustrated partial coverage allows the top source electrode 55S and the top drain electrode 55D to be electrically connected to the corresponding interface contacts 52S and 52D, respectively. The top source electrode 55S and the top drain electrode 55D may also fully cover the first semiconducting channel layer 531 in the first source region and first drain region, respectively. They also in this case may be connected to the underlying interface contacts, for example with an additional electric contact routed past the channel layer 531.

Top source electrodes 55S and top drain electrodes 55D may be either non-transparent or at least partly transparent. The electrical connection illustrated between these top electrodes and the corresponding interface contacts in FIG. 5e allows the charge density in the semiconducting layer to be limited and/or controlled. If non-transparent materials are used in the electrodes 55S and 55D, they also allow the first source region and first drain region to be optically shaded.

Fourth Embodiment

Figure 6A:
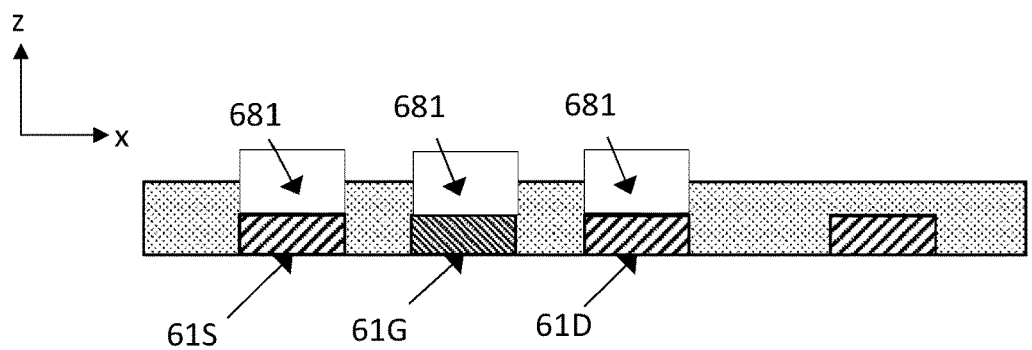
FIGS. 6a-6b illustrate the manufacturing of a MESFET arrangement according to a fourth embodiment.
Figure 6B:
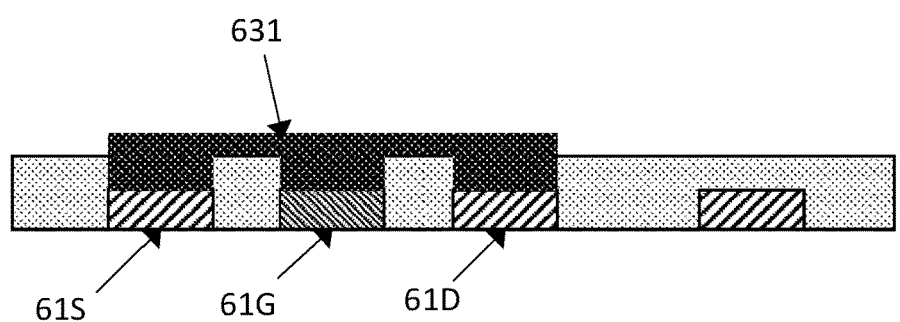

If the metal contact in the first gate region in the wiring layer comprises a different metal than the metal contacts in the first source region and the first drain region, then the semiconducting channel 631 may be deposited directly over all metal contacts in these regions. FIGS. 6a and 6b illustrate an arrangement where the metal contacts in the first source and drain regions 61S and 61D are made of a first metallic material, and the metal contact in the gate region 61G is made of a second metallic material. Assuming again by way of example that the channel is made of PbS, with suitably chosen materials, for example indium or gold in the source and drain electrodes 61S and 61D, the junction between the bottom source electrode 61S and the channel 631 will be ohmic, and the junction between the bottom drain electrode 61D and the channel 631 will be ohmic. If for example aluminium or titanium is used in the gate electrode 61G, the junction between the bottom gate electrode 61G and the channel 631 will be a Schottky junction.

The deposition process illustrated in FIGS. 6a-6b is simpler than the processes illustrated in the preceding embodiments, but an additional deposition and masking step is instead needed in the earlier manufacturing stages (which are not illustrated) to deposit metal contacts of two different kinds in the wiring layer.

Fifth Embodiment

Depending on the MESFET threshold voltage, a MESFET transistor can be characterized either as an enhancement-type (E-type) MESFET (which is normally "off") or a depletion-type (D-TYPE) MESFET (which is normally "on"). The MESFET threshold voltage depends on the doping of the semiconducting channel layer, on its thickness and on material parameters such as the work function difference between the gate electrode and the semiconducting channel.

It is possible to prepare both E-type and D-type MESFETs on the same substrate either by doping the semiconducting channel layer differently in two gate regions, or by preparing two MESFET transistor with different materials in the gate electrode. Since shifting doping profiles can be relatively complicated to implement in most semiconducting channel materials, the latter approach may usually be preferable.

This fifth embodiment describes a metal-semiconductor field-effect transistor arrangement where two MESFET transistors are prepared on the same substrate. In addition to a first MESFET transistor, which may correspond to any of the first MESFET transistors described in the preceding embodiments, the arrangement comprises a second MESFET transistor on the same substrate surface as the first MESFET transistor, wherein the topmost wiring layer also comprises a second source region with a second bottom source electrode, a second drain region with a second bottom drain electrode, and a second gate region with a second bottom gate electrode, wherein each of the second bottom source, bottom drain and bottom gate electrodes comprises at least an electrically conducting second metal contact.

The arrangement also comprises a second semiconducting channel layer which at least partly covers the second bottom source electrode, the second bottom drain electrode and the second bottom gate electrode. The interface between the second bottom source electrode and the second semiconducting channel layer is an ohmic junction, the interface between the second bottom drain electrode and the second semiconducting channel layer is an ohmic junction, and the interface between the second bottom gate electrode and the second semiconducting channel layer is a Schottky junction. One of the first and second MESFET transistors is an enhancement-type MESFET, and the other of the first and second MESFET transistors is a depletion-type MESFET.

Figure 7A:
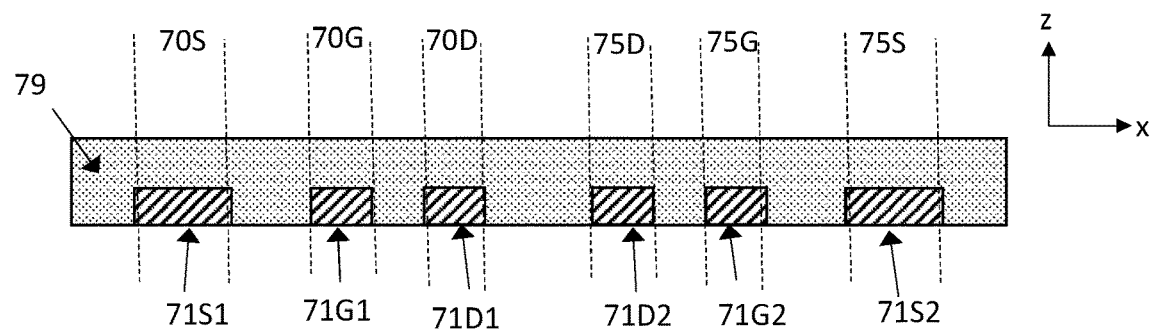
FIGS. 7a-7j illustrate the manufacturing of a MESFET arrangement according to a fifth embodiment.

FIGS. 7a-7j illustrate a manufacturing method for a MESFET transistor arrangement according to this fifth embodiment. FIG. 7a illustrates the topmost wiring layer on a substrate, which may for example be a CMOS substrate. The topmost wiring layer includes a number of metal/metallic contacts and an insulating layer 79. Reference numbers 70S, 70G, 70D, 71S1, 71G1 and 71D1 correspond to reference numbers 30S, 30G, 30D, 31S, 31G and 31D in FIG. 3a. The topmost wiring layer also includes a second source region 75S, a second gate region 75G and a second drain region 75D.

In the example illustrated in FIGS. 7a-7j, the corresponding metal contacts 71D2, 71G2 and 71S2 are all made of the same metal. The metal contacts 71S1, 71G1 and 71D1 for the first MESFET transistor are also made of the same metal. If the contacts 71G1 and 71G2 would be made of a different metal, process steps similar to the ones illustrated in FIGS. 6a-6b may be used.

Figure 7B:
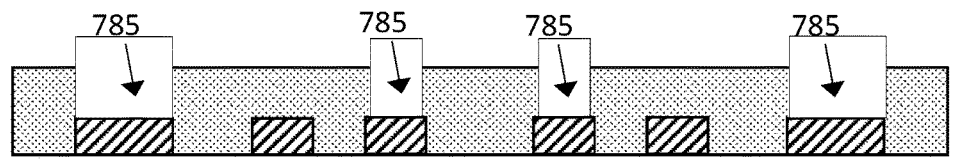
Figure 7C:
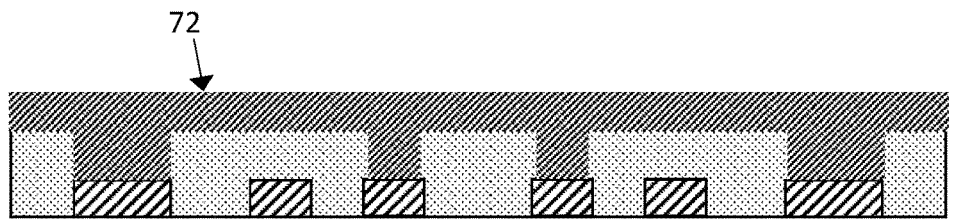
Figure 7D:
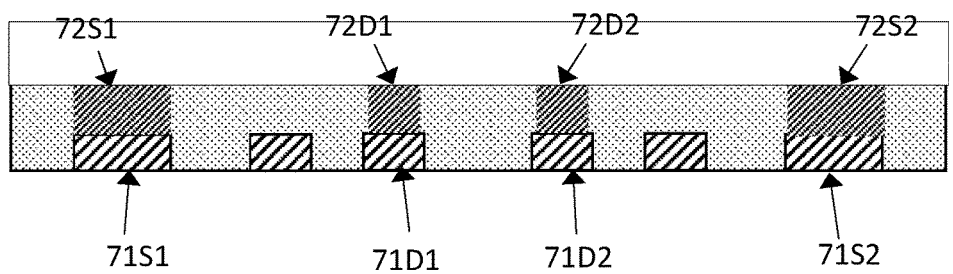

Returning to the example, in FIG. 7b first openings 785 have been formed in the insulating material 79, and a layer of first interface contact material 72 is then deposited on the topmost wiring layer in FIG. 7c. After the material 72 has been partially etched, the wiring layer comprises a first bottom source electrode with metal contact 71S1 and interface contact 72S1, a second bottom source electrode with metal contact 71S2 and interface contact 72S2, a first bottom drain electrode with metal contact 71D1 and interface contact 72D1, and a second bottom drain electrode with metal contact 71D2 and interface contact 72D2.

Figure 7E:
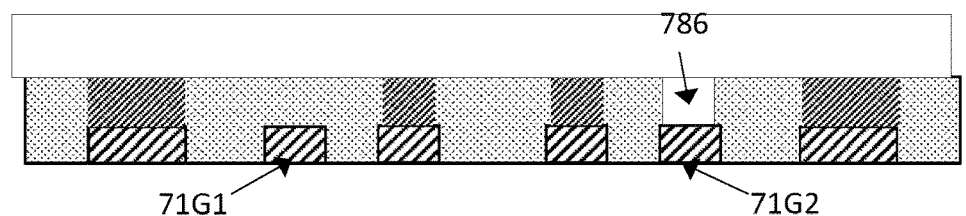
Figure 7F:
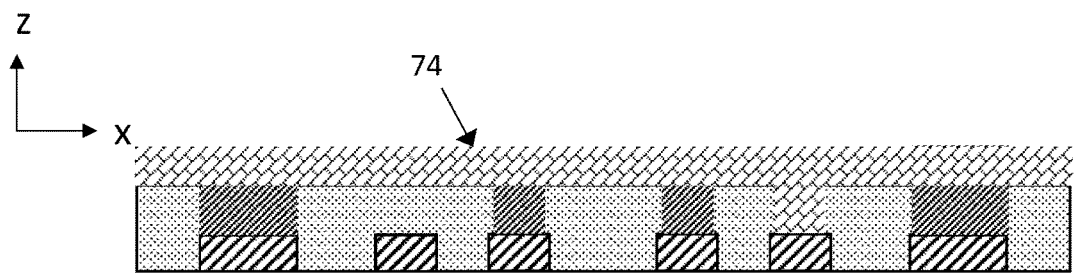
Figure 7G:
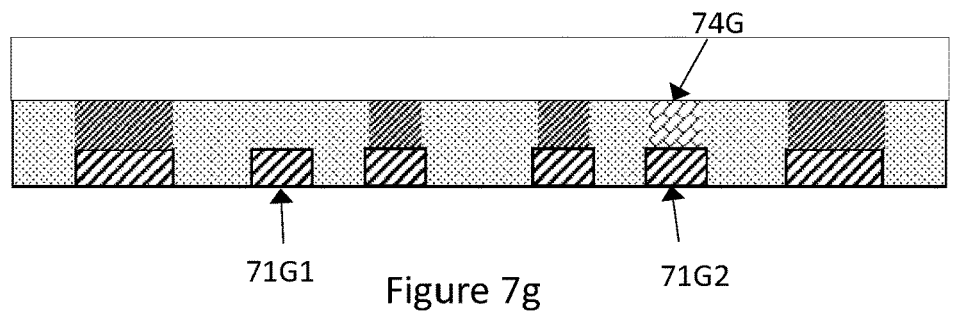
Figure 7H:
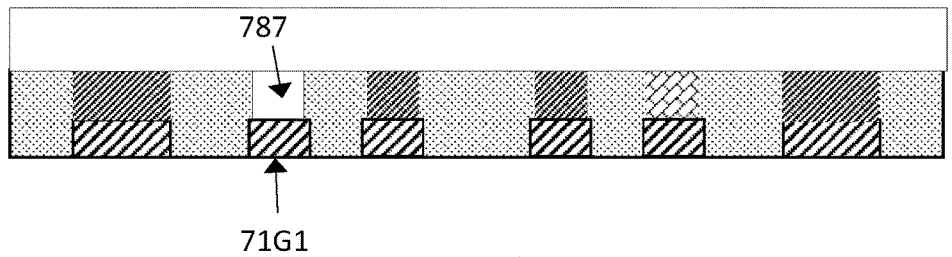
Figure 7I:
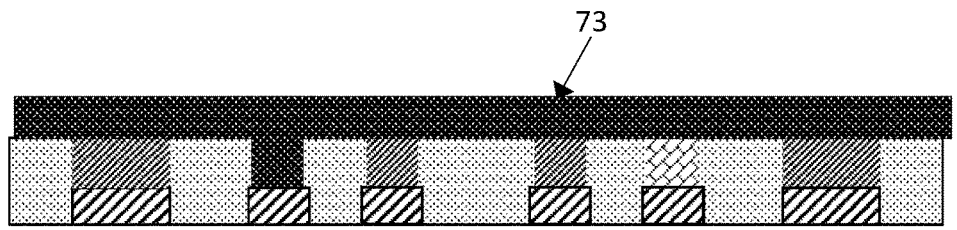
Figure 7J:
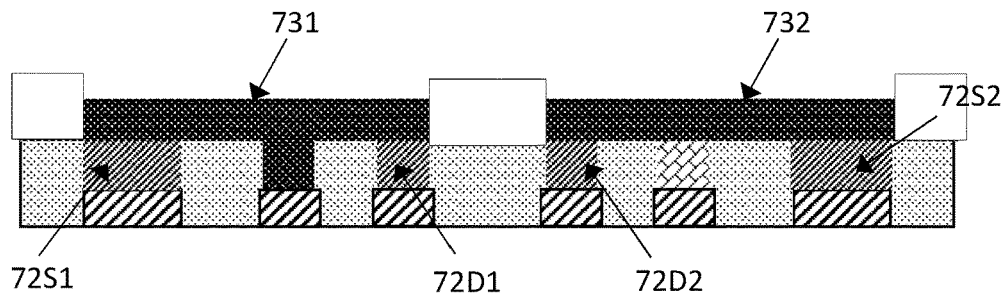

A second opening 786 may then be etched in the insulating material 79 in the second gate region 75G, as illustrated in FIG. 7e. A second interface contact material 74 may be used to fill this opening, as illustrated in FIGS. 7f and 7g. The second bottom gate electrode in the second gate region 75G thereby comprises metal contact 71G2 and interface contact 74G, while the first bottom gate electrode comprises only metal contact 71G1. A third opening 787 is made to this first bottom gate electrode in FIG. 7h. A layer of semiconducting material 73 may then be deposited on the wiring layer and optionally patterned, as illustrated in FIGS. 7i-7j, so that a first semiconducting channel 731 covers the first bottom source, bottom gate and bottom drain electrodes, and a second semiconducting channel 732 covers the second bottom source, bottom gate and bottom drain electrodes. However, if the semiconducting material has a sufficiently low conductivity, the two MESFET transistors may also utilize the unitary layer of semiconducting material 73 in FIG. 7i as their common channel layer. The two MESFET transistors can in this case be operated independently without significant crosstalk. In other words, the second semiconducting channel layer may be the same layer as the first semiconducting channel layer.

One combination of materials which could be utilized in this fifth embodiment is for example that the first interface contact material 72 may be gold, ITO or similar, the second interface contact material 74 may be titanium, aluminum or similar, and the semiconducting material 73 is PbS or similar. In case 73 is CdS, the first interface contact material 72 could be In/Au, and 74 could be gold. This material selection provides ohmic (non-rectifying) contacts for MESFET sources and drains and Schottky type (rectifying) contacts to MESFET gates. Some of the suitable materials for these purposes may need additional barrier layers next to aluminium-based wiring layers that are typically used in CMOS technology.

In the embodiment illustrated in FIG. 7j, if the interface contacts 72S1 and 72D1 in the source and drain regions of the first MESFET transistor are labelled first interface contacts, and if the interface contact in the gate region of the first MESFET transistor (which is optional, and not illustrated in FIGS. 7a-7j) is labelled a second interface contact, then the second bottom source electrode may comprise a third interface contact 72S2 which is covered by the second semiconducting channel layer 732 and which covers the second metal contact 71S2 in the second source region, and the second bottom drain electrode may comprise a third interface contact 72D2 which is covered by the second semiconducting channel layer 732 and which covers the second metal contact 71D2 in the second drain region, so that the third interface contacts 72S2 and 72D2 form the interface to the second semiconducting channel layer 732 in the second source and drain regions.

The second bottom gate electrode may comprise a fourth interface contact 74G which is covered by the second semiconducting channel layer 732 and which covers the second metal contact in the second gate region, so that the fourth interface contact 74G forms the interface to the second semiconducting channel layer 732 in the second gate region.

FIGS. 7a-7j illustrate a method where the third interface contacts are made of the same material 72 as the first interface contacts 72S1 and 72D1, but they could also be made of a different material if two separate deposition steps would be carried out in FIG. 7c.

The optional features illustrated in the third and fourth embodiments can also be utilized in conjunction with the fifth embodiment. In other words, the arrangement may further comprise a second top gate electrode which at least partly covers the second semiconducting channel layer 732 in the second gate region.

Similarly, the arrangement may also comprise a second top source electrode which at least partly covers the second semiconducting channel layer 732 in the second source region, and a second top drain electrode which at least partly covers the second semiconducting channel layer 732 in the second drain region.

Furthermore, it is also possible to utilize separate semiconducting materials in the channel layers of the two MESFET transistors. In this alternative implementation, two openings 786 could for example be prepared in FIG. 7e, the second one (which is not now illustrated) above the metal contact 71G1. Optional interface contacts could then be deposited in the two openings 786, either so that both interface contacts comprise the same material, or so that the first interface contact comprises one material and the second interface contacts comprises another material. A first semiconducting channel layer, made of a first semiconducting material, could then be deposited over the first bottom source, gate and drain electrodes, and a second semiconducting channel layer, made of a second semiconducting material, could then be deposited over the second bottom source, gate and drain electrodes. Of course, extra masking and etching steps are needed every time different materials are deposited over the two transistors, and it may sometimes be preferable to build simpler structures which require fewer processing steps.

The E-type and D-type MESFETs illustrated in FIG. 7i may be used also for non-optical purposes. They for example form logic elements or amplifiers. The power consumption of such ED-MESFET circuitry can often be lower than the power consumption of CMOS circuitry. The ED-MESFET circuitry can be powered by a single-sided power supply, which may be the same as the underlying CMOS circuit utilizes.

Pixel Embodiment

Figure 8A:
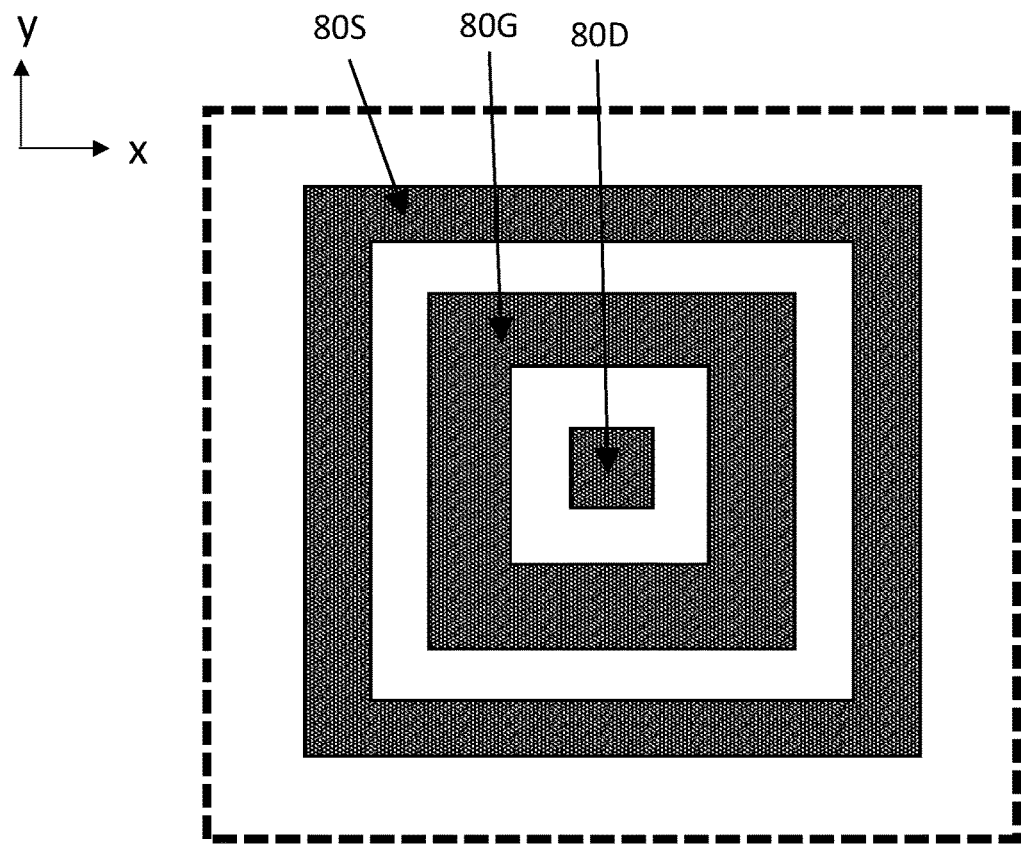
FIGS. 8a-8b illustrate an example of a pixel geometry for MESFET transistor arrangements.

FIG. 8a illustrates a pixel geometry for the MESFET transistors described in this disclosure when they are used as optical sensors. The same geometries can be used in any of the preceding embodiments. In this example, reference numbers 80S, 80G and 80D correspond to reference numbers 30S, 30G and 30D, respectively, in the first embodiment.

The source region 80S is at the edge of the pixel, the drain region 80D in the middle. The gate region 80G occupies an area in between, so that it surrounds the drain region in the horizontal plane. Multiple pixels may share the same bottom source electrode if the same source region 80S extends to multiple pixels and surrounds their respective gate and drain regions. The source and drain regions 80S and 80D are substitutable with each other, so that the drain region instead surrounds the source region. The shape of the pixel may for example be rectangular, round, oval, or it may be square as in FIG. 8a.

Figure 8B:
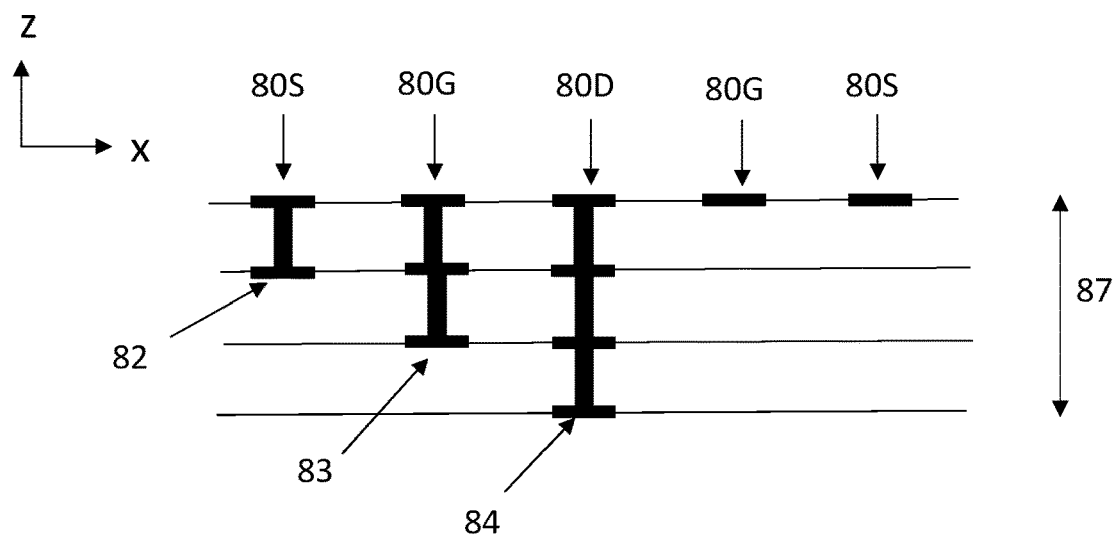

FIG. 8b shows an xz-cross-section of the same pixel geometry, where the underlying stack of wiring layers 87 is schematically illustrated. One way to interconnect the electrodes of multiple pixels on the same substrate is for example to form the source, gate and drain electrodes 80S, 80G and 80D in the topmost wiring layer, and to interconnect all source electrodes in the electrodes 82 formed in the second wiring layer, and to interconnect all gate electrodes in the electrodes 83 formed in the third wiring layer, and to interconnect all drain electrodes in the electrodes 84 formed in the fourth wiring layer. If the fourth wiring layer is at the bottom of the stack of wiring layers, the electrodes 84 may optionally function also as the gate electrodes of the pMOS and nMOS transistors in the CMOS substrate, as described above.

In accordance with the embodiments presented above, the semiconducting channel layer may be deposited over the wiring layer after the corresponding electrodes have been formed. A single unitary semiconducting layer may in some cases be used to cover the bottom source, bottom gate and bottom drain electrodes of all pixels on the surface. The channel of each MESFET transistor then comprises the portion of the unitary semiconducting layer which overlies its source, drain and gate electrodes. Alternatively, the semiconducting layer may be patterned, so that the channels of at least some MESFET transistors are electrically separated from the channels of other MESFET transistors on the same substrate.

The invention claimed is:

1. A metal-semiconductor field-effect transistor (MESFET) arrangement comprising:
   a first MESFET on a horizontal surface of a substrate with at least one wiring layer on the horizontal surface, wherein a topmost wiring layer of the at least one wiring layer comprises a first source region with a first bottom source electrode, a first drain region with a first bottom drain electrode, and a first gate region with a first bottom gate electrode, wherein each of the first bottom source electrode, the first bottom drain electrode and the first bottom gate electrode comprises at least an electrically conducting first metal contact,
   a first semiconducting channel layer on the topmost wiring layer, wherein the first semiconducting channel layer at least partly covers the first bottom source electrode, the first bottom drain electrode and the first bottom gate electrode,
   wherein an interface between the first bottom source electrode and the first semiconducting channel layer is an ohmic junction, an interface between the first bottom drain electrode and the first semiconducting channel layer is an ohmic junction, and an interface between the first bottom gate electrode and the first semiconducting channel layer is a Schottky junction, wherein the substrate is a complementary metal-oxide-semiconductor (CMOS) silicon substrate and the topmost wiring layer is connected to a CMOS circuit in the CMOS silicon substrate, wherein the topmost wiring layer lies between the substrate and the semiconducting channel layer in a vertical direction, and wherein the vertical direction is perpendicular to the horizontal surface of the substrate.

2. A metal-semiconductor field-effect transistor arrangement according to claim 1, wherein the first bottom source electrode also comprises a first interface contact which is covered by the first semiconducting channel layer and which covers the first metal contact in the first source region, and the first bottom drain electrode also comprises a first interface contact which is covered by the first semiconducting channel layer and which covers the first metal contact in the first drain region, so that the first interface contact of the first bottom source electrode and the first interface contact of the first bottom drain electrode form the interface to the first semiconducting channel layer in the first source region and first drain region.

3. A metal-semiconductor field-effect transistor arrangement according to claim 1, wherein the first bottom gate electrode also comprises a second interface contact which is covered by the first semiconducting channel layer and which covers the first metal contact in the first gate region, so that the second interface contact forms an interface to the first semiconducting channel layer in the first gate region.

4. A metal-semiconductor field-effect transistor arrangement according to claim 1, wherein the arrangement further comprises a first top gate electrode which at least partly covers the first semiconducting channel layer in the first gate region.

5. A metal-semiconductor field-effect transistor arrangement according to claim 1, wherein the arrangement further comprises a first top source electrode which at least partly covers the first semiconducting channel layer in the first source region, and a first top drain electrode which at least partly covers the first semiconducting channel layer in the first drain region.

6. A metal-semiconductor field-effect transistor arrangement according to claim 1, wherein the arrangement further comprises:
a second MESFET on the horizontal surface of the substrate as the first MESFET, wherein topmost wiring layer also comprises a second source region with a second bottom source electrode, a second drain region with a second bottom drain electrode, and a second gate region with a second bottom gate electrode, wherein each of the second bottom source electrode, the second bottom drain electrode and the second bottom gate electrode comprises at least an electrically conducting second metal contact,
a second semiconducting channel layer on the topmost wiring layer, wherein the second semiconducting channel layer at least partly covers the second bottom source electrode, the second bottom drain electrode and the second bottom gate electrode,
wherein an interface between the second bottom source electrode and the second semiconducting channel layer is an ohmic junction, an interface between the second bottom drain electrode and the second semiconducting channel layer is an ohmic junction, and an interface between the second bottom gate electrode and the second semiconducting channel layer is a Schottky junction,
and wherein one of the first MESFET and the second MESFET is an enhancement-type MESFET, and the other of the first MESFET and the second MESFET is a depletion-type MESFET.

7. A metal-semiconductor field-effect transistor arrangement according to claim 6, wherein the second bottom source electrode also comprises a third interface contact which is covered by the second semiconducting channel layer and which covers the second metal contact in the second source region, and the second bottom drain electrode also comprises a third interface contact which is covered by the second semiconducting channel layer and which covers the second metal contact in the second drain region, so that the third interface contacts form an interface to the second semiconducting channel layer in the second source region and the second drain region.

8. A metal-semiconductor field-effect transistor arrangement according to claim 6, wherein the second bottom gate electrode also comprises a fourth interface contact which is covered by the second semiconducting channel layer and which covers the second metal contact in the second gate region, so that the fourth interface contact forms an interface to the second semiconducting channel layer in the second gate region.

9. A metal-semiconductor field-effect transistor arrangement according to claim 6, wherein the arrangement further comprises a second top gate electrode which at least partly covers the second semiconducting channel layer in the second gate region.

10. A metal-semiconductor field-effect transistor arrangement according to claim 6, wherein the arrangement further comprises a second top source electrode which at least partly covers the second semiconducting channel layer in the second source region, and a second top drain electrode which at least partly covers the second semiconducting channel layer in the second drain region.

* * * * *